United States Patent [19]
Sauvanet

[11] 3,961,235
[45] June 1, 1976

[54] STATIC SWITCH CONTROLLER SYNCHRONIZED WITH A PASSAGE TO ZERO OF THE SUPPLY VOLTAGE

[75] Inventor: Maurice Sauvanet, Fontenay-le-Fleury, France

[73] Assignee: Silec-Semi-Conducteurs, Societe Anonyme, Paris, France

[22] Filed: Aug. 15, 1974

[21] Appl. No.: 497,798

[30] Foreign Application Priority Data

Sept. 11, 1973  France .............................. 73.32646

[52] U.S. Cl. ........................... 323/18; 307/252 UA; 323/22 SC; 323/39
[51] Int. Cl.² ....................................... H03K 17/56
[58] Field of Search ......... 307/133, 252 N, 252 UA; 317/11 A; 323/16, 18, 19, 22 SC, 39

[56] References Cited
UNITED STATES PATENTS

| | | | |
|---|---|---|---|
| 3,447,041 | 5/1969 | Sandstrom | 307/133 X |
| 3,579,096 | 5/1971 | Buchanan | 307/133 X |
| 3,840,784 | 10/1974 | Schauffele | 323/22 SC |

*Primary Examiner*—A. D. Pellinen
*Attorney, Agent, or Firm*—Sughrue, Rothwell, Mion, Zinn & Macpeak

[57] ABSTRACT

A static switch controller synchronized with a passage to zero of the supply voltage, and which is insensitive to spurious firing currents is disclosed. A static switch is controlled by a control circuit having output terminals and input terminals. An alternating rectified voltage is applied across the output terminals and a closing signal is applied across the input terminals. The control circuit comprises a thyristor and a blocking circuit which blocks the cathode of the thyristor when the rectified voltage exceeds a threshold value.

5 Claims, 9 Drawing Figures

STATIC SWITCH CONTROLLER SYNCHRONIZED WITH A PASSAGE TO ZERO OF THE SUPPLY VOLTAGE

BACKGROUND OF THE INVENTION

1. Field of the Invention

The present invention relates to a static switch control device synchronized with a passage to zero of the supply voltage (alternating or rectified).

2. Description of the Prior Art

The advantages of firing a static switch at zero voltage are described, in particular, in copending U.S. patent application Ser. No. 367,938, filed on June 7, 1973, now U.S. Pat No. 3,848,158. In the prior art, a known static relay comprises a thyristor-type switch for a rectified current, or a triac or group of thyristors for an alternating current. The control current of this switch is supplied by an auxiliary thyristor placed between a main electrode and the gate control electrode of the static switch, and may be supplied via a rectifier bridge. An active circuit element, such as a transistor, is disposed between the gate and the cathode of the auxiliary thyristor. This transistor short-circuits the closing signal when the feed voltage is greater than a threshold value. However, while the thyristor is desensitized in this way with respect to the closing signal, it can still be fired by parasitic voltage gradients occurring between its anode and its cathode, or by internal leakage currents which occur when the junctions are at a high temperature and the anode - cathode voltage is also high.

SUMMARY OF THE INVENTION

An object of the present invention is to provide a new method and apparatus for desensitizing an auxiliary thyristor, whereby the thyristor is insensitive to parasitic tripping owing to voltage gradients or to internal leakage currents.

In the present invention the auxiliary thyristor is desensitized at times other than when the rectified feed voltage passes below a threshold value, instead of short-circuiting the control voltage as in the prior art methods. In this way, desensitization is obtained with respect to the closing signal applied to the gate, to parasitic voltage drops occurring between the anode and cathode, and to parasitic currents resulting from the movement of stored charges or junction leakages. The process according to the present invention consists in raising either the potential of the cathode of the auxiliary thyristor with respect to that of the gate or the impedance of the cathode circuit of the auxiliary thyristor, or in raising both the potential and the impedance, when the feed voltage exceeds a threshold value $V_s$.

DESCRIPTION OF THE PREFERRED EMBODIMENT

Figure 1:
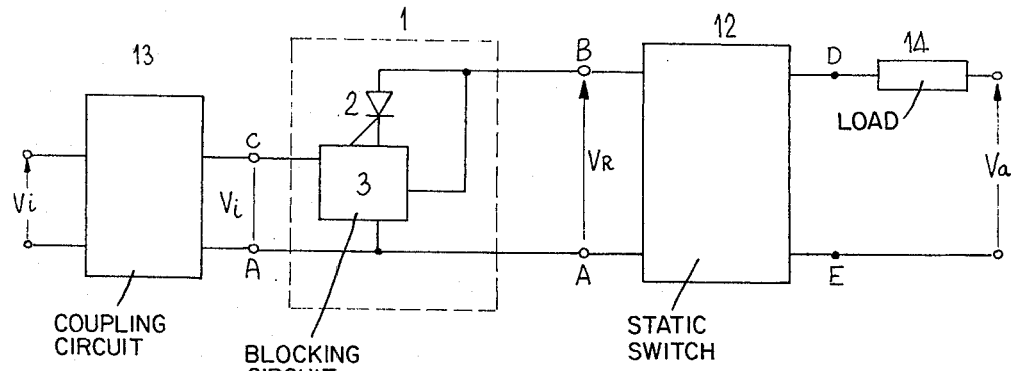
FIG. 1 is a general view of a main static switch and its control circuit according to the invention.

In reference to FIG. 1, a static switch control device according to the invention consists of a control circuit 1 comprising an auxiliary thyristor 2 and a blocking circuit 3 connected to the cathode of the thyristor. Input terminals C and A of circuit 1 are connected to the output of a coupling circuit 13, the input of which receives the closing signal. The output terminals B and A of control circuit 1 are connected to the control input of a static switch 12 designed to interrupt or allow the passage of the current from a feed voltage $V_a$ into a load 14.

Figure 2:
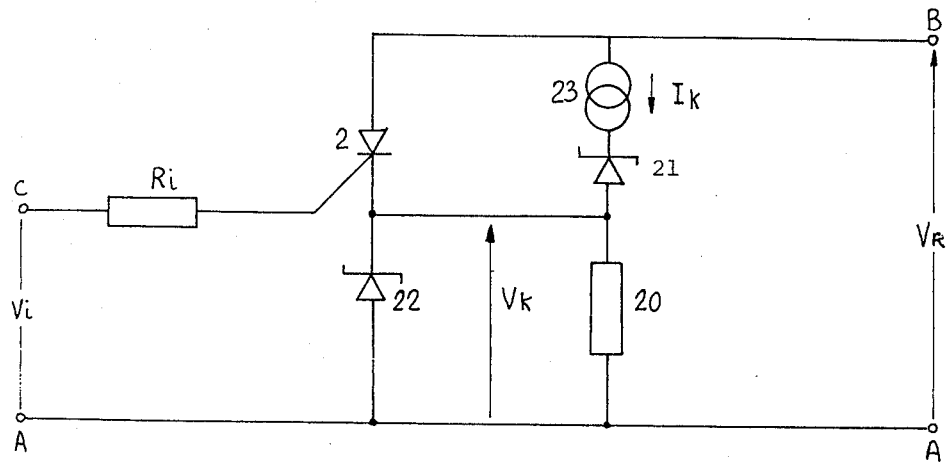
FIG. 2 represents a first embodiment of the control circuit of the present invention.

In the embodiment of the control circuit 1 shown in FIG. 2, $V_R$ represents the rectified voltage applied between the terminals B and A and $V_i$ is the voltage representing the closing signal applied between terminals C and A. Terminal C is connected to the gate of thyristor 2 through an input resistor $R_i$. The anode of thyristor 2 is connected to the output terminal B. The cathode of thyristor 2 is connected to the common terminal A by way of an impedance 20 mounted in parallel with a Zener diode 22. In addition, the cathode and anode of the thyristor 2 are connected via a current generator 23 producing a current $I_k$ and a Zener diode 21. The Zener diodes 21 and 22 have Zener voltages $V_1$ and $V_2$, respectively. The current source 23 and the impedance 20, having a value Z, are selected so that the voltage $ZI_k$ is greater than the closing signal voltage $V_i$.

If the voltage $V_R$ is lower than the threshold value $V_s$, close to $V_1$, the diode 21 is not conducting and the current $I_k$ cannot flow in the impedance 20. The voltage of the cathode of the thyristor 2 is then zero and any closing order $V_i$ applied to the gate can trigger the thyristor into the conducting state. Thyristor current flows in the Zener diode 22 as soon as the voltage drop across the impedance 20 is greater than the Zener voltage $V_2$ of the Zener diode 22.

If, on the other hand, $V_R$ is greater than the threshold value $V_s$, the Zener diode 21 becomes conductive and allows the passage of the current $I_k$ which raises the potential of the cathode to the value $ZI_k$ which is greater than the value $V_i$. The gate is then negatively polarized with respect to the cathode and there can be no triggering of the thyristor 2 by the control voltage $V_i$. In addition, the advantage of insensitivity to spurious firing as mentioned above is obtained owing to the fact that a rapid acceleration of the voltage $V_R$ cannot trigger the thyristor 2 since the cathode voltage is greater than the voltage of the gate. The generator 23 of current $I_k$ may be a field effect device or a similar known device for obtaining a current having minimal dependence on the voltage at its terminals.

Figure 3:
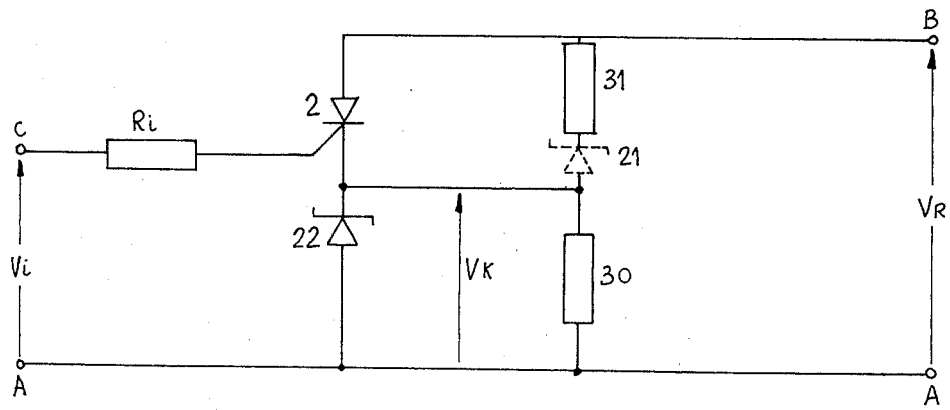
FIG. 3 represents a variant of the first embodiment shown in FIG. 2.

FIG. 3 shows another embodiment of the present invention in which the current generator is not used. The cathode of thyristor 2 is connected to the central tap of a voltage divider comprising the impedances 31 and 30 and having the values $Z_1$ and $Z_2$, respectively. The other terminal of the impedance 31 is connected to the input terminal B and the other terminal of the impedance 30 is connected to the input terminal A. The use of the Zener diode 21 is optional in this arrangement, as shown by the chain lines. To obtain triggering of the auxiliary thyristor 2, the following must apply:

$$V_i > V_k,$$

$V_k$ being the potential of the cathode, as given by:

$$V_k = \frac{Z_2}{Z_1 + Z_2} (V_R - V_1).$$

It is then possible for triggering to occur when the voltage $V_R$ is lower than a threshold value $V_s$, such that:

$$V_s = V_1 + \left(\frac{Z_1 + Z_2}{Z_2}\right) V_i.$$

If the Zener diode 21 is eliminated, the term $V_1$ must be removed from the above equation.

In the embodiments represented in FIGS. 2 and 3 an input resistance $R_i$ is inserted in the gate circuit since, if the source providing the control voltage $V_i$ has a very low internal resistance, the gate voltage must be able to rise above the value $V_2$ when the thyristor is rendered conducting.

In the first embodiment represented in FIGS. 2 and 3, the main switch (triac or anti-parallel thyristors) can only be activated or switched from one alternation to another when the rectified feed voltage $V_R$ attains a sufficient value for the Zener diode 22 to be rendered conducting, that is, a voltage equal to the sum of the value $V_2$ and the voltage drop of the auxiliary thyristor 2.

Figure 4:
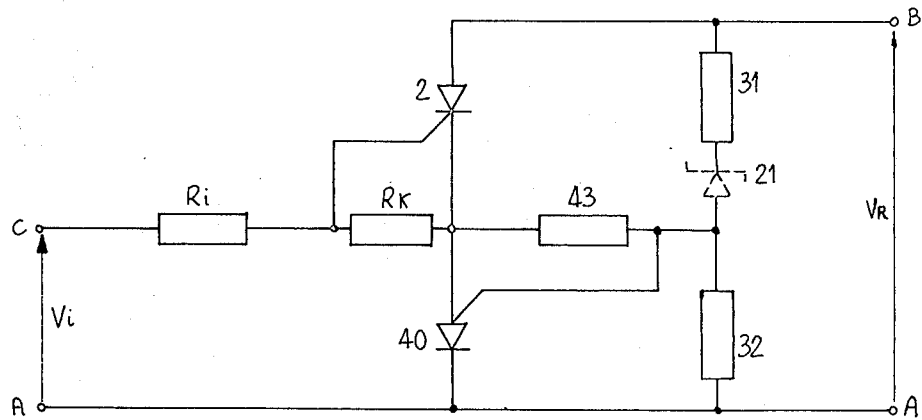
FIGS. 4, 4a, 5 show different variants of a second embodiment of the present invention.
Figure 5:
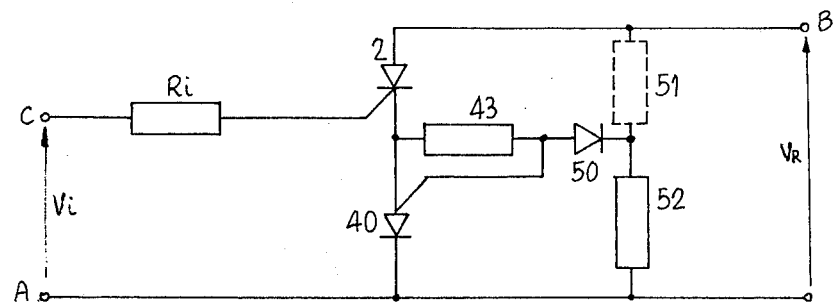

To produce activation of the main switch at zero voltage or at very nearly zero voltage, a second embodiment is provided according to the invention, two variants of which are represented in FIGS. 4 and 5 and in which the Zener diode 22 is replaced by a device having a negative characteristic such that the voltage at its terminals decreases rapidly as soon as it is rendered conducting.

FIG. 4 represents a first variant of this second embodiment. As in the case of FIG. 3, it comprises the resistor $R_i$, the thyristor 2, the impedances 31 and 32 having the values $Z_1$ and $Z_2$, and the optional Zener diode 21. An anode gate thyristor 40 is arranged so that its cathode is connected to the common terminal A and its anode to the cathode of the thyristor 2. Its anode gate is connected to the center tap between the impedances 31 and 32. An impedance 43 is disposed between the anode and the gate of this thyristor 40. In addition, a resistor $R_k$ is connected between the cathode and the gate of the thyristor 2.

When the voltage across the impedance 32 is lower than the control voltage $V_i$, that is, the rectified voltage $V_R$ is lower than:

$$V_s = V_1 + \left(\frac{Z_1 + Z_2}{Z_2}\right) V_i$$

(neglecting two junction voltages), the voltage at the anode gate of the thyristor 40 is lower by at least one junction voltage than the voltage at its anode and thyristor 40 is activated. This causes thyristor 2 to be rendered conducting. If, on the other hand, the voltage across impedance 32 exceeds or is equal to $V_i$, the anode gate thyristor 40 is blocked and the impedance 43 carries back to the cathode of thyristor 2 a voltage which renders it highly insensitive as described in connection with the first embodiment. A resistor $R_k$ may be inserted between the gate and the cathode of the thyristor 2, thereby constituting with the resistor 43 a voltage divider which prevents the gate — cathode junction of the thyristor 2 from being reverse biased over its breakdown voltage.

Figure 4A:
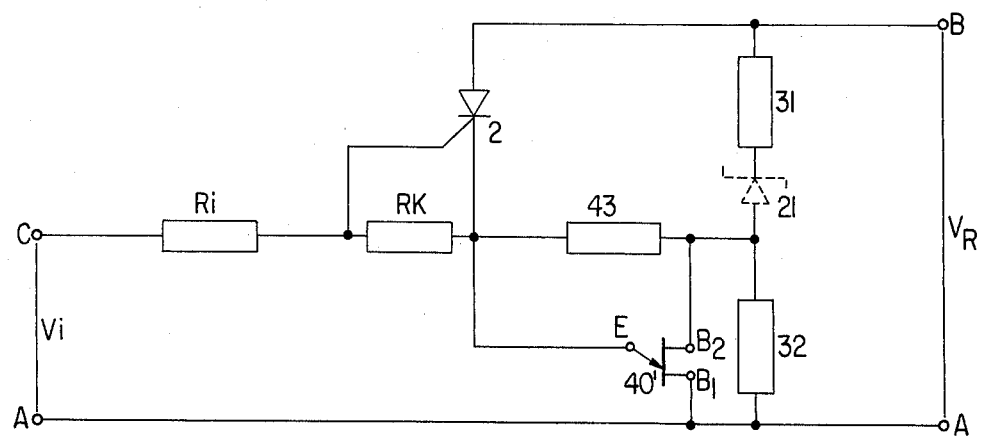

The anode gate thyristor 40 can obviously be replaced by any other device acting in a similar manner, such as a unijunction transistor. This modification is shown in FIG. 4a. In this figure, the emitter E of the unijunction transistor 40' is connected instead of the anode of the anode gate thyristor 40. The second base B2 is connected instead of the gate of the anode gate thyristor 40, and the first base of the unijunction transistor is connected instead of the cathode of the thyristor 40. The unijunction transistor conducts between the emitter E and the first base B1 when the voltage of the second base B2 is smaller than the voltage on the emitter E.

In the embodiments described above, the desensitization of thyristor 2 is obtained by reverse biasing its gate — cathode junction by applying a blocking voltage to the cathode. The desensitization effect obtained by the presence of a high impedance on the cathode of the thyristor 2 is, in many cases, sufficient. It is then possible to use a variant such as the one shown in FIG. 5.

In reference to FIG. 5, the thyristor 2 is connected in series with a thyristor 40 as in the embodiment of FIG. 4. In the voltage divider constituted by the impedances 51 and 52 having the values $Z_1$ and $Z_2$ respectively, the impedance 51 may have a zero value and a diode 50 is inserted between the anode gate of the thyristor 40 and the center tap between the impedances 51 and 52. A threshold value $V_s$ is then obtained, such that:

$$V_s = \left(\frac{Z_2 + Z_1}{Z_2}\right) V_i - 3V_j,$$

$V_j$ being the voltage of a junction polarized in the forward direction. When $Z_1 = 0$, the following applies:

$$V_s = V_i - 3V_j.$$

Figure 6:
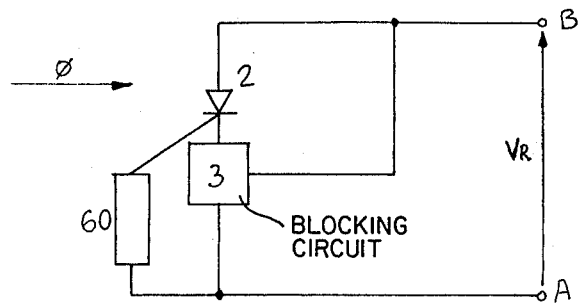
FIG. 6 represents a third embodiment of the present invention in which the auxiliary thyristor is a photothyristor.

Numerous variants of the present invention which will be readily apparent to the person skilled in the art are also posible. For example, as is well known, the control signal between the terminals C and A may be an alternating voltage. In a particular embodiment, the closing signal may be applied to the gate of thyristor 2 by the application of energy in the form of thermal, electromagnetic or light rays. If thyristor 2 is a photothyristor, the closing signal can be a light flux $\phi$ from a light emitter optically coupled with the junction of the gate. In this case, which is diagrammatically indicated in FIG. 6, the gate connection will be connected to the common terminal A by way of a resistor or impedance 60 having a lower value than the impedance of the blocking circuit 3 inserted between the cathode and terminal A.

Figure 7:
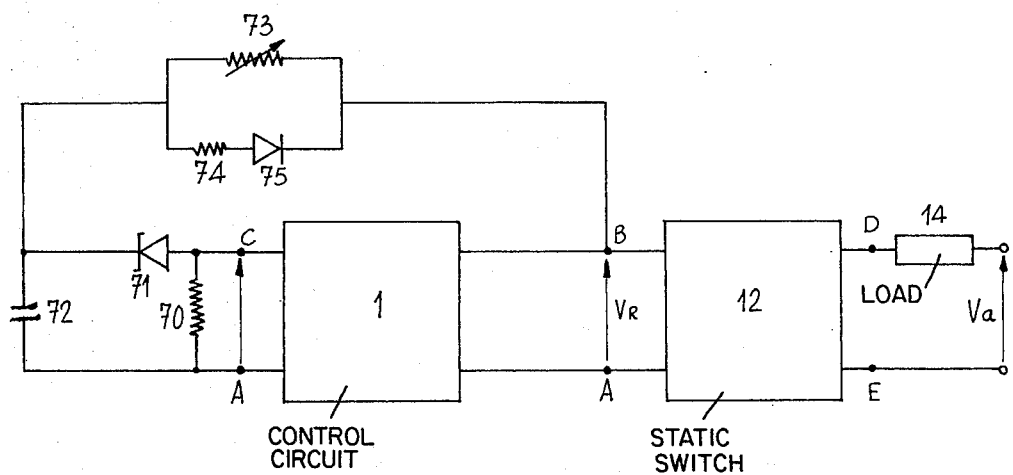
FIG. 7 is a diagrammatic view of the application of a device according to the present invention in a power varying element.
Figure 8:
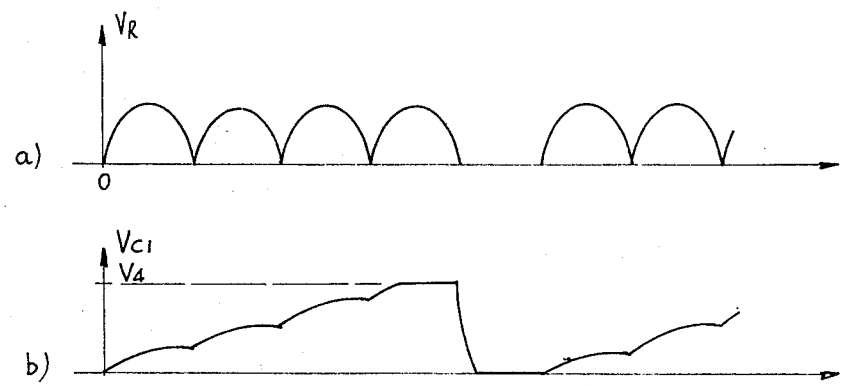
FIGS. 8a and 8b represent evolution curves of the voltage as a function of time by way of explanation of the power varying element according to FIG. 7.

In reference to FIGS. 7, 8a and 8b, an example of the application of a control device for a static switch synchronized with the passage to zero according to the present invention will now be provided.

It is known in the prior art that by controlling a static relay by way of periodic signals of variable duration, a power varying element is obtained. A particular embodiment of a power varying element of this type employing the control circuit according to the present invention will be described in reference to FIG. 7.

The elements 14, 12 and 1 and the voltages $V_a$ and $V_R$ correspond to the elements and voltages bearing the same references in FIG. 1. The control voltage is applied between the terminals C and A through a circuit comprising a resistor 70 connected in parallel between the terminals C and A, a Zener diode 71 and a condensor 72 arranged in series and also connected in parallel between the terminals C and A. The connection point between the Zener diode 71 and the condensor 72 is connected to the terminal B by way of a circuit comprising a variable resistor 73 mounted in parallel to a resistor 74 and a diode 75 connected in series. FIG. 8a represents the voltage $V_R$ as a function of time and FIG. 8b represents the voltage $V_{C1}$ having the value C1 at the terminals of the condensor 72 as a function of time, $V_4$ being the Zener voltage of the diode 71.

If the condensor 72 is discharged at zero, it is then charged progressively through the variable resistor 73 during each cycle of the rectified voltage $V_R$. When the voltage $V_{C1}$ exceeds the threshold voltage $V_4$ of the Zener diode 71 during the nth cycle, the circuit 1 is triggered at the zero crossing following this nth cycle. Consequently, the static switch is fired through the circuit 1 for one cycle and the process recommences. If one cycle is controlled in this way, the power through the load 14 will be 1/n times the power through it in the absence of the static switch. The value n depends on the setting of resistor 73. The resistor 74 and the diode 75 are designed to discharge the condensor 72 after activation of the control circuit.

What is claimed is:

1. An electric circuit for controlling a static switch in synchronism with the passage to zero of the feed voltage comprising:
   a. an auxiliary thyristor provided with an anode, a cathode and a gate;
   b. a control signal source means for applying a control signal to the gate of said auxiliary thyristor;
   c. a feed source means comprising a first terminal and a second terminal;
   d. an anode gate thyristor comprising an anode, a cathode and a gate, the anode of which is connected with the cathode of said auxiliary thyristor and the cathode of which is connected with said second terminal;
   e. an impedance connected between the anode and the anode gate of the anode gate thyristor;
   f. means connected to said first terminal for rectifying the current from said feed source means; and
   g. a biasing impedance connected between the anode gate and the cathode of the anode gate thyristor, said impedance being biased by the rectified current from said rectifying means, whereby a load current may flow in the auxiliary thyristor when the instantaneous value of the rectified voltage becomes lower than a threshold value.

2. An electrical circuit according to claim 1 wherein said rectifying means comprises a diode, the anode of which is connected with the anode gate of the anode gate thyristor and the cathode of which is connected with a terminal of said biasing impedance.

3. An electrical circuit according to claim 1 wherein the auxiliary thyristor is a photo-thyristor, further comprising an impedance connected between said gate and said second terminal, said control signal source means applying said control signal by optical coupling to the gate junction of said auxiliary thyristor.

4. An electrical circuit as claimed in claim 1 for controlling a main controlled static switch wherein the controlled signal is applied to the gate of the auxiliary thyristor through a circuit comprising:
   a. a first resistor connected between the gate of the auxiliary thyristor and said second terminal;
   b. a Zener diode and a condenser in parallel with said first resistor;
   c. a second resistor in parallel with a third resistor serially connected with a diode, connecting the rectified feed source to the junction of said Zener diode and said condenser, whereby the main controlled static switch operates as a power varying element by alternation suppression, the variation rate being a function of the value of the time constant of said second resistor and said condensor.

5. An electric circuit for controlling a static switch in synchronism with the passage to zero of the feed voltage comprising:
   a. an auxiliary thyristor provided with an anode, a cathode and a gate;
   b. a control signal source means for applying a control signal to the gate of said auxiliary thyristor;
   c. a feed source means comprising a first terminal and a second terminal;
   d. a unijunction transistor comprising an emitter, a first base and a second base, the emitter of which is connected with the cathode of said auxiliary thyristor and the first base of which is connected with said second terminal;
   e. an impedance connected between the emitter and the second base of the unijunction transistor;
   f. means connected to said first terminal for rectifying the current from said feed source means; and
   g. a biasing impedance connected between the second base and the first base of the unijunction transistor, said impedance being biased by the rectified current from said rectifying means, whereby a load current may flow in the auxiliary thyristor when the instantaneous value of the rectified voltage becomes larger than a threshold value.

* * * * *